US009533875B2

(12) United States Patent
Han et al.

(10) Patent No.: US 9,533,875 B2
(45) Date of Patent: Jan. 3, 2017

(54) MEMS SENSOR PACKAGING AND METHOD THEREOF (71) Applicant: U Electronics Co., Ltd., Suwon-si (KR)

(72) Inventors: Yong Hee Han, Namyangju-si (KR); Hyung Won Kim, Suwon-si (KR); Mi Sook Ahn, Suwon-si (KR)

(73) Assignee: U Electronics Co., Ltd., Suwon-si (KR)

( * ) Notice: Subject to any disclaimer, the term of this patent is extended or adjusted under 35 U.S.C. 154(b) by 341 days.

(21) Appl. No.: 14/357,046

(22) PCT Filed: Nov. 9, 2012

(86) PCT No.: PCT/KR2012/009447
§ 371 (c)(1),
(2) Date: May 8, 2014

(87) PCT Pub. No.: WO2013/070013
PCT Pub. Date: May 16, 2013

(65) Prior Publication Data
US 2014/0306312 A1    Oct. 16, 2014

(30) Foreign Application Priority Data

Nov. 10, 2011    (KR) .......................... 10-2011-0117153

(51) Int. Cl.
*B81B 7/00*    (2006.01)
*G01P 15/08*    (2006.01)
(Continued)

(52) U.S. Cl.
CPC .............. *B81B 7/0038* (2013.01); *B81B 7/007* (2013.01); *B81C 1/00269* (2013.01);
(Continued)

(58) Field of Classification Search
CPC ....... B81C 1/00539; B81C 7/0032; B81C 7/02
See application file for complete search history.

(56) References Cited

U.S. PATENT DOCUMENTS

2003/0102079 A1    6/2003    Kalvesten et al.
2004/0077117 A1    4/2004    Ding et al.
(Continued)

FOREIGN PATENT DOCUMENTS

CN        1363509 A      8/2002
CN      101243010 A      8/2008
(Continued)

*Primary Examiner* — Mohammad Choudhry
(74) *Attorney, Agent, or Firm* — The Webb Law Firm (57) ABSTRACT A micro electro mechanical systems (MEMS) sensor packaging includes a first wafer having a readout integrated circuit (ROIC) formed thereon, a second wafer disposed corresponding to the first wafer and having a concave portion on one side thereof and a MEMS sensor prepared on the concave portion, joint solders formed along a surrounding of the MEMS sensor and sealing the MEMS sensor jointing the first and second wafers, and pad solders formed to electrically connect the ROIC circuit of the first wafer and the MEMS sensor of the second wafer. According to the present disclosure, in joining and packaging a wafer having the ROIC formed thereon and a wafer having the MEMS sensor formed thereon, the size of a package can be reduced and an electric signal can be stably provided by forming internally pad solders for electrically connecting the ROIC and the MEMS sensor.

7 Claims, 6 Drawing Sheets (51) Int. Cl.
 *B81C 1/00* (2006.01)
 *H01L 31/02* (2006.01)
(52) U.S. Cl.
 CPC ...... *B81C 1/00285* (2013.01); *G01P 15/0802* (2013.01); *H01L 31/02016* (2013.01); *B81B 2201/0207* (2013.01); *B81B 2201/0235* (2013.01); *B81B 2201/0242* (2013.01); *B81B 2207/096* (2013.01); *B81C 2203/0118* (2013.01); *H01L 2224/291* (2013.01)

(56) References Cited

U.S. PATENT DOCUMENTS

| | | |
|---|---|---|
| 2005/0023629 A1 | 2/2005 | Ding et al. |
| 2006/0063462 A1 | 3/2006 | Ding et al. |
| 2006/0244085 A1 | 11/2006 | Gore et al. |
| 2007/0035001 A1 | 2/2007 | Kuhmann et al. |
| 2009/0029152 A1 | 1/2009 | Yun et al. |
| 2009/0127639 A1 | 5/2009 | Suzuki et al. |
| 2009/0194829 A1 | 8/2009 | Chung et al. |
| 2010/0252898 A1 | 10/2010 | Tanaka et al. |
| 2010/0258950 A1 | 10/2010 | Li et al. |

FOREIGN PATENT DOCUMENTS

| | | |
|---|---|---|
| CN | 101355038 A | 1/2009 |
| CN | 101391742 A | 3/2009 |
| CN | 101519183 A | 9/2009 |
| CN | 101533832 A | 9/2009 |
| EP | 2165970 A2 | 3/2010 |
| JP | 2003520447 | 7/2003 |
| JP | 2006116694 A | 5/2006 |
| JP | 2007516092 | 6/2007 |
| JP | 2008034515 A | 2/2008 |
| JP | 2010032292 A | 2/2010 |
| KR | 10-0705007 | 4/2007 |

MEMS SENSOR PACKAGING AND METHOD THEREOF

CROSS-REFERENCE TO RELATED APPLICATIONS

This application is the United States national phase of International Application No. PCT/KR2012/009447 filed Nov. 9, 2012, and claims priority to Korean Patent Application No. 10-2011-0117153 filed Nov. 10, 2011, the disclosures of which are hereby incorporated in their entirety by reference.

TECHNICAL FIELD

The present disclosure relates to a micro electro mechanical systems (MEMS) sensor packaging and a method thereof, and particularly to a MEMS sensor packaging and a method thereof capable of reducing a size of a package and stably providing an electric signal by forming internally pad solders for electrically connecting a readout integrated circuit (ROIC) and a MEMS sensor in joining and packaging a wafer having the ROIC circuit formed thereon and a wafer having the MEMS sensor formed thereon.

BACKGROUND ART

MEMS refer to a technology field fabrication a sensor, a micro actuator or a gyroscope by using a semiconductor fabrication technology. Accordingly, precision processing, uniformity of products, and high productivity of the semiconductor technology are applied to the MEMS, and performance thereof is enhanced and cost is reduced.

MEMS devices, for example, an acceleration sensor, a gyro sensor, and a resonant gyroscope are packaged for protection or sensitivity increase. As the rapid development of the MEMS device manufacturing technology, high density and miniaturization of the MEMS device are realized and accordingly, miniaturization of a package thereof is necessary.

Accordingly, a wafer level packaging is frequently attempted which performs packaging in a wafer state having a device formed thereon.

A MEMS device package by typical wafer level packaging has a structure in which a substrate for a glass-based cover and a substrate for a silicon-based device are joined by anodic-bonding. However, due to the thickness of the glass substrate for the cover, the thickness of the package becomes greater and, due to large via holes formed in the glass substrate, there is limitation in reducing the size of the package. Using such a large size MEMS device package results in disturbing minimization of the device.

In addition, since a method of arraying each device on a plane in a unit device state and using a wire bonding process maintains air-tightness by using a cap on the device in the case where hermetic characteristics of the MEMS device is required, the package dimension of the entire package is large and a process thereof is complex.

An aspect of the present disclosure provides a MEMS sensor packaging and a method thereof capable of reducing a size of a package and stably providing an electric signal by forming internally pad solders for electrically connecting a readout integrated circuit (ROIC) and a MEMS sensor in joining and packaging a wafer having the ROIC circuit formed thereon and a wafer having the MEMS sensor formed thereon.

Technical issues of the present invention are not limited to those described above and other technical issues will be clearly understood by those skilled in the art from the following description.

SUMMARY OF THE INVENTION

According to an aspect of the present invention, there is provided a micro electro mechanical systems (MEMS) sensor packaging including: a first wafer having a readout integrated circuit (ROIC) formed thereon; a second wafer disposed corresponding to the first wafer and having a concave portion on one side thereof and a MEMS sensor prepared on the concave portion; joint solders formed along a surrounding of the MEMS sensor and sealing the MEMS sensor by jointing the first and second wafers; and pad solders formed to electrically connect the ROIC circuit of the first wafer and the MEMS sensor of the second wafer.

The first wafer may include a substrate; electrode pads of the ROIC circuit formed on the substrate; an insulating layer formed to expose the electrode pads; a filler metal filling via holes penetrating through the substrate for electrically connected to the electrode pads; and a getter formed on the insulating layer.

The getter may include one or more selected from a group consisting of Ba, Ca, Mg, Ti, V, Zr, Nb, Mo, Ta, Th, and Ce, or one or more selected from a metal alloy group consisting of Ba—Al, Zr—Al, Ag—Ti, and Zr—Ni.

The second wafer may include a substrate having a space formed by the concave portion formed on the one side thereof; wetting layers formed in a predetermined pattern on the substrate; and a MEMS sensor connected to the wetting layers and disposed separately in a predetermined interval from a position corresponding to a position at which the concave portion is formed.

The wetting layers may be formed in a pad pattern to be connected to both electrodes of the MEMS sensor and in a ring pattern along the surrounding of the MEMS sensor.

The MEMS sensor may be prepared in a diaphragm structure or a comb structure.

The MEMS sensor may include an infrared detecting device.

The infrared detecting device may include a filter unit selectively transmitting an infrared ray having a wavelength of 8 to 12 μm.

The infrared detecting device may include a micro bolometer.

According to another aspect of the present invention, there is provided a MEMS sensor packaging method including: removing a predetermined portion of an insulating layer to expose electrode pads of a first wafer on which an ROIC circuit is formed; forming pad solders in the predetermined portion where the electrode pads are exposed and ring type joint solders along a surrounding of a MEMS sensor; forming a getter on the first wafer on which the pad solders and the joint solders are formed; and jointing a second wafer on which the MEMS sensor is formed on the first wafer on which the getter is formed.

The joint solders and the pad solders may be formed from a metal material.

The joint solders and the pad solders may be formed by using any one of a physical sputter, a thermal deposition process or a chemical plating process.

The jointing may be to joint the first and second wafers by using any one of thermo-compression (TC) bonding or eutectic bonding.

The getter may be formed from a material comprising one or more selected from a group consisting of Ba, Ca, Mg, Ti, V, Zr, Nb, Mo, Ta, Th, and Ce, or one or more selected from a metal alloy group consisting of Ba—Al, Zr—Al, Ag—Ti, and Zr—Ni.

The second wafer may include, on the substrate, wetting layers in a pad type pattern, which are electrically connected to both side electrodes of the MEMS sensor, and wetting layers in a ring type pattern along the surrounding of the MEMS sensor, the joint solders are jointed correspondingly to the ring type pattern wetting layers and the pad solders are jointed correspondingly to the pad type pattern wetting layers.

The MEMS sensor may be electrically connected to the ROIC through the pad solders.

As set forth above, according to exemplary embodiments of the present disclosure, in joining and packaging a wafer having the ROIC circuit formed thereon and a wafer having the MEMS sensor formed thereon, the size of a package can be reduced and an electric signal can be stably provided by forming internally pad solders for electrically connecting a readout integrated circuit (ROIC) and a MEMS sensor.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION AND BEST MODE

Exemplary embodiments of the present invention will now be described in detail with reference to the accompanying drawings. However, in the following description, detailed descriptions of well-known functions or constructions will be omitted since they would obscure the invention in unnecessary detail.

Also, the same or similar reference numerals provided in each drawing denote the same or similar components.

In the description, if certain portions are described as being connected to other portions, they are not only directly connected to the other portions, but also connected to the other portions by means of any other device. Unless otherwise defined, it will be further understood that the terms "comprises" and/or "comprising" used herein specify the presence of stated features or components, but do not preclude the presence or addition of one or more other features or components.

Hereinafter, the embodiments of the present invention will now be described in detail with reference to the accompanying drawings.

Figure 1:
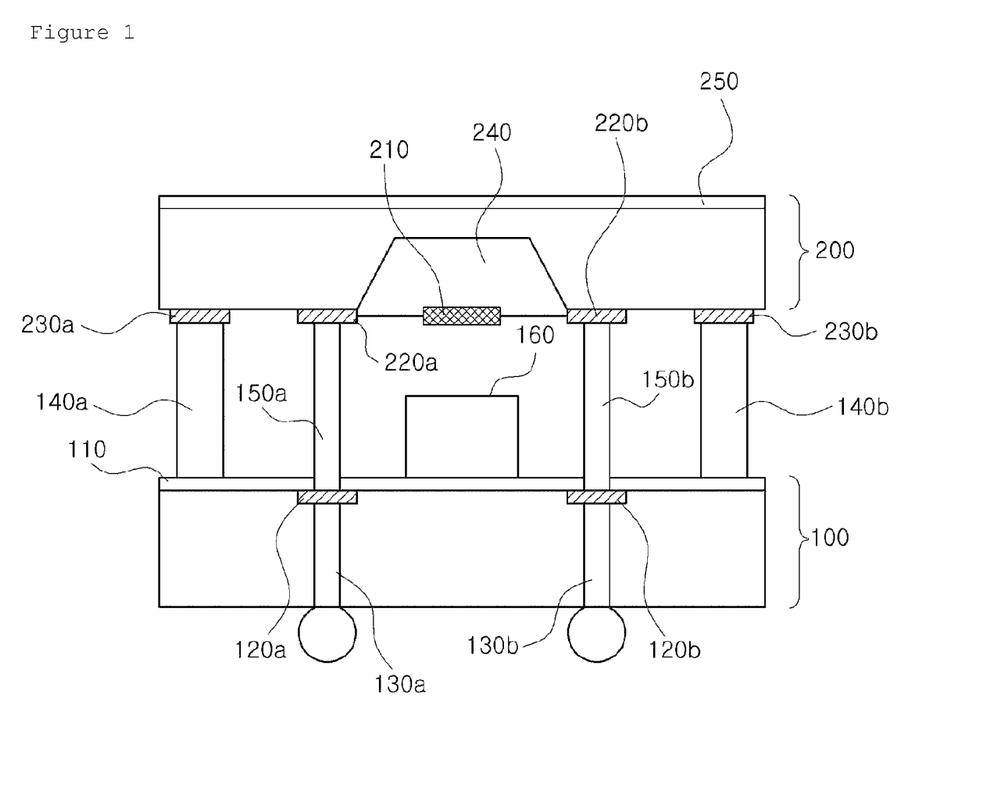
FIG. 1 schematically illustrates a micro electro mechanical systems (MEMS) sensor packaging structure according to an exemplary embodiment of the present invention.
Figure 2:
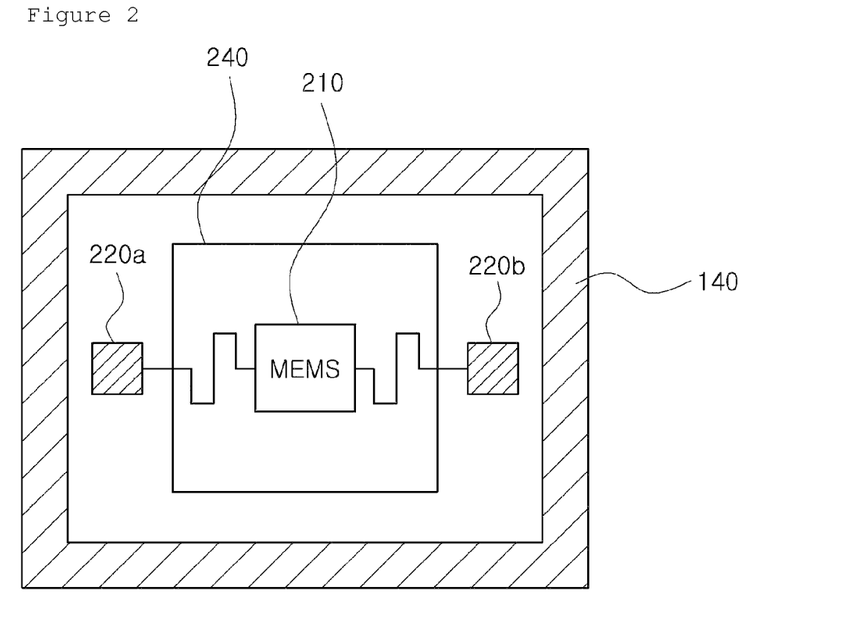
FIG. 2 is a plan view illustrating a structure in which joint solders and pad solders of a MEMS sensor packaging are formed according to an exemplary embodiment of the present invention.

FIG. 1 schematically illustrates a micro electro mechanical systems (MEMS) sensor packaging structure according to an embodiment of the present invention. FIG. 2 is a plan view illustrating a structure in which joint solders and pad solders of the MEMS sensor packaging are formed according to an embodiment of the present invention. As illustrated in FIGS. 1 and 2, the MEMS sensor packaging according to an embodiment of the present invention includes a first wafer 100 having a readout integrated circuit (ROIC) formed thereon, a second wafer 200 disposed corresponding to the first wafer 100, having a concave portion 240 on one side thereof and having MEMS sensor 210 prepared in the concave portion, joint solders 140 formed along the surrounding of the MEMS sensor 210 so that the MEMS sensor 210 is sealed by jointing the first and second wafers 100 and 200, and pad solders 150 through which the ROIC circuit of the first wafer 100 and the MEMS sensor of the second wafer 200 are electrically connected.

The first wafer 100 includes a substrate, electrode pads 120a and 120b of the ROIC circuit formed on the substrate, an insulating layer 110 formed to be exposed the electrode pads 120a and 120b, filler metals 130a and 130b filling via holes penetrating through the substrate for electrically connected to the electrode pads 120a and 120b, and a getter 160 formed on the insulating layer 110.

The substrate includes the ROIC for driving the MEMS sensor 210 and electrode pads 120a and 120b for delivering or receiving a certain electrical signal to or from the outside.

The insulating layer 110 is a protection layer for preventing the substrate from being damaged from succeeding processes or preventing a short circuit with a device from occurring, and formed from $SiO_2$ or $SiN_x$, etc.

After penetrating via holes on the substrate, the filler metals 130a and 130b are formed by each of the via holes is filled with a metal. Here, in filling the via holes, any one metal of Sn, Cu, Sn/Bi, Sn/In, Au/Sn, and Sn/Ag/Cu may be used. Here, due to the filler metals filling the via holes, an electrical signal may be received or output outside the substrate.

The getter 160 is formed on a predetermined area where the insulating layer 110 is formed on the substrate. In detail, the getter indicates a material absorbing or forming a compound with a gas remained in a vacuum apparatus. Here, as a material for forming the getter, a metal is used which has strong reaction with moisture and oxygen, has a low melting point, and is easily evaporable. Adsorption of the metal allows moisture or a gas permeating into the device to be removed. Such a material includes one or more selected from a group consisting of Ba, Ca, Mg, Ti, V, Zr, Nb, Mo, Ta, Th, and Ce, or one or more selected from a metal alloy group consisting of Ba—Al, Zr—Al, Ag—Ti, and Zr—Ni.

The second wafer 200 includes a substrate in which a space is prepared by forming the concave portion 240 on one side, wetting layers 220a, 220b, 230a, and 230b formed in a predetermined pattern on the substrate, and the MEMS sensor 210 disposed separately in a predetermined interval from a position corresponding to a position at which the concave portion is formed.

The substrate has the one side in which the concave portion 240 is formed for mounting the MEMS sensor 210 thereon. Here, the MEMS sensor 210 is not mounted inside the concave portion 240 but is mounted in a floated type having a space.

The wetting layers 220a, 220b, 230a, and 230b are formed in a predetermined pattern with a conductive metal material through a process such as sputtering or metal organic chemical vapor deposition (MOCVD). Namely, the wetting layers 220a, 220b, 230a, and 230b are formed in a pad type pattern 220a and 220b to be connected to both side electrodes of the MEMS sensor 210 and in a ring type pattern 230a and 230b along the surrounding of the MEMS sensor 210.

The MEMS sensor 210 is connected to each pad of the wetting layers 220a, 220b, 230a, and 230b and prepared to be floated in a space of the concave portion 240. Here, the MEMS sensor 210 may be prepared in various types such as a diaphragm structure or a comb structure.

In addition, the MEMS sensor 210 includes a infrared detecting device and, in the case where the infrared detecting device is employed, a filter unit selectively transmitting the infrared ray having a wavelength of 8 to 12 μm. Here, the infrared detecting device may include a micro bolometer.

The joint solders 140a and 140b use a bonding member jointing and sealing the first and second wafers 100 and 200, and are formed to enclose the MEMS sensor 210 in order to protect the MEMS sensor 210 from the outside.

The pad solders 150a and 150b electrically connect the MEMS sensor 210 and the ROTC, and allow an electrical signal to be stably received and output. That is, air-tightness of the MEMS sensor packaging can be increased while the package dimension thereof can be reduced and the manufacturing process thereof can be simplified by connecting an electrical signal without an external wire bonding process.

In detail, a solderable layer including the joint solders 140a and 140b and the pad solders 150a and 150b may be formed through a physical sputter, a thermal deposition process or a chemical plating process. If necessary, the solderable layer may be formed in a scheme of depositing an under-bump-metallurgy (UBM), namely, an adhesion layer and the solderable layer, and then forming a conductive bonding material. The solderable layer used as a joint layer may include a pure metal such as Indium (In), tin (Sn), or an Indium-based, tin-based, bismuth-based, or lead (Pb)-based alloy. When the solderable layer is used as the bonding layer, the bonding layer has joint characteristics in low temperature and enables a metal cover to be jointed to a carrier substrate, and has fusion characteristics in high temperature and enables the carrier substrate to be detached.

Furthermore, a MEMS sensor packaging method is described according to an embodiment of the present invention.

FIGS. 3 to 6 are process flowcharts for the MEMS sensor packaging method according to an embodiment of the present invention.

Figure 3:
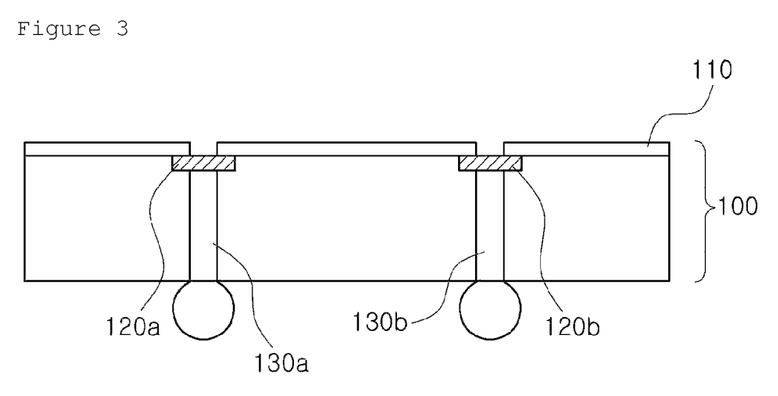
FIGS. 3 to 6 are process flowcharts of a MEMS sensor packaging method according to an exemplary embodiment of the present invention.

First, as shown in FIG. 3, removing a predetermined portion of the insulating layer 110 is performed such that the electrode pads 120a and 120b of the first wafer 100 on which the ROIC circuit is formed are exposed.

In detail, the first wafer 100 includes the substrate, the electrode pads 120a and 120b of the ROIC circuit formed on the substrate, the insulating layer 110 formed on the electrode pads 120a and 120b, filler metals 130a and 130b filling the via holes penetrating through the substrate and electrically connected to the electrode pads 120a and 120b, and the getter 160 formed on the insulating layer 110. The insulating layer 110 is a protection layer for preventing the substrate from being damaged from succeeding processes or preventing a short circuit with a device from occurring, and formed from $SiO_2$ or $SiN_x$, etc.

Here, the insulating layer 110 is removed to expose the electrode pads 120a and 120b through an etching process and the solders 150 are formed on the electrode pads 120a and 120b.

On the other hand, a first wafer process of forming the ROIC circuit may adopt a typical process and detailed description thereabout is omitted.

Figure 4:
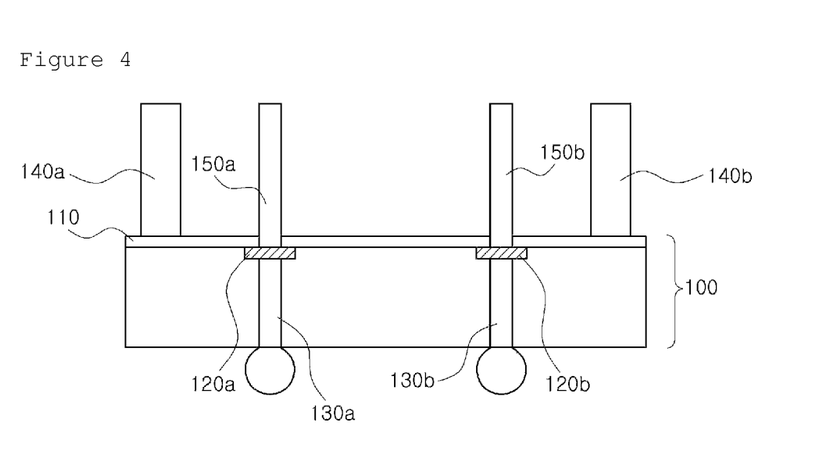

As shown in FIG. 4, forming the ring type joint solders 140 is performed along the surrounding corresponding to the pad solders 150 and the MEMS sensor 210 on a predetermined portion where the electrode pads 120a and 120b are exposed.

In detail, the solderable layer including the joint solders 140a and 140b and the pad solders 150a and 150b may be formed through a physical sputter, a thermal deposition process, or a chemical plating process. If necessary, the solderable layer may be formed in a scheme of depositing a UBM, namely, an adhesion layer and the solderable layer and then forming a conductive bonding material. The solderable layer used as a joint layer may include a pure metal such as Indium (In), tin (Sn), or an Indium-based, tin-based, bismuth-based, or lead (Pb)-based alloy. When the solderable layer is used as the bonding layer, the bonding layer has joint characteristics in low temperature and enables a metal cover to be jointed to a carrier substrate, and has fusion characteristics in high temperature and enables the carrier substrate to be detached.

Namely, the joint solders 140a and 140b use a bonding member jointing and sealing the first and second wafers 100 and 200, and are formed to enclose the MEMS sensor 210 for protecting the MEMS sensor 210 from the outside.

In addition, the pad solders 150a and 150b electrically connect the MEMS sensor 210 and the ROIC circuit and allow an electrical signal to be stably received and output. That is, the package dimension of the MEMS sensor packaging can be reduced and the manufacturing process thereof can be simplified by connecting an electrical signal without an external wire bonding process.

Figure 5:
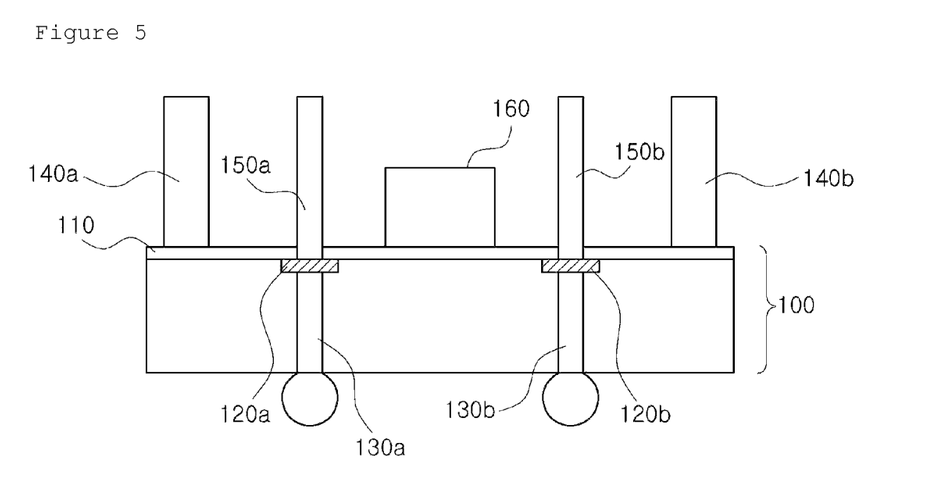

As shown in FIG. 5, forming the getter 160 is performed on the first wafer 100 on which the pad solders 150a and 150b and the joint solders 140a and 140b are formed Here, as a material for forming the getter, a metal is used which has strong reaction with moisture and oxygen, has a low melting point, and is easily evaporable. Adsorption of the metal allows moisture or a gas permeating into the device to be removed. Such a material includes one or more selected from a group consisting of Ba, Ca, Mg, Ti, V, Zr, Nb, Mo, Ta, Th, and Ce, or one or more selected from a metal alloy group consisting of Ba—Al, Zr—Al, Ag—Ti, and Zr—Ni.

Figure 6:
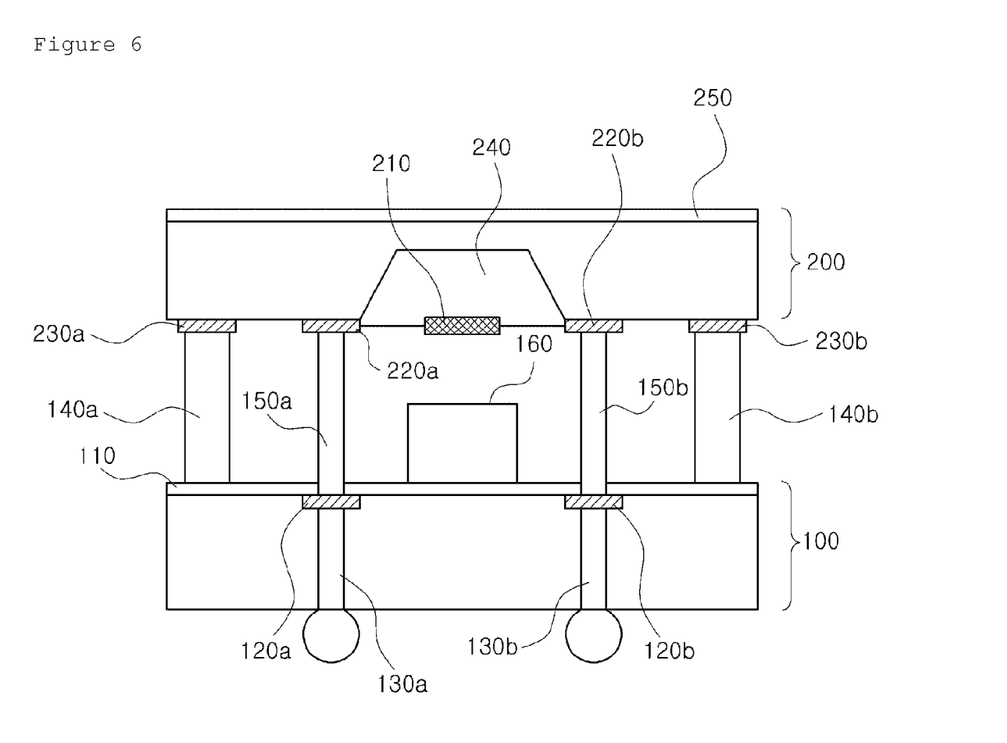

As shown in FIG. 6, jointing the second wafer 200 on which the MEMS sensor 210 is formed is performed on the first wafer 100 on which the getter 160 is formed.

In detail, the jointing method enables the first and second wafers 100 and 200 to be jointed by using a thermocompression (TC) bonding method or a eutectic bonding method.

Here, the pad solders 150a and 150b and the joint solders 140a and 140b formed on the first wafer 100 and the wetting layers 220a, 220b, 230a, and 230b formed on the second wafer 200 are jointed. Namely, the wetting layers 220a, 220b, 230a, and 230b are formed in a pad type pattern in order to be connected to both electrodes of the MEMS sensor 210 and in a ring type pattern along the surrounding of the MEMS sensor 210. The joint solders 140a and 140b are jointed correspondingly to the ring type pattern wetting layer 230a and 230b and the pad solders 150a and 150b are jointed correspondingly to the pad type pattern wetting layer 220a and 220b.

Accordingly, the MEMS sensor 210 is electrically connected to the ROIC through the pad solders 150a and 150b, and an electrical signal may be stably received and output. Namely, air-tightness of the MEMS sensor packaging can be increased while the package dimension thereof can be reduced and the manufacturing process thereof can be simplified by connecting an electrical signal without an external wire bonding process.

While the present invention has been shown and described in connection with the exemplary embodiments, it will be apparent to those skilled in the art that modifications and variations can be made without departing from the spirit and scope of the invention as defined by the appended claims.

According to an embodiment of the present invention, in jointing and packaging a wafer on which an ROIC is formed and a wafer on which a MEMS sensor is formed, the size of a package can be reduced and an electrical signal can be stably provided by internally forming pad solders which electrically connect the ROIC and the MEMS sensor.

The invention claimed is:

1. A MEMS sensor packaging method comprising:
   removing a predetermined portion of an insulating layer to expose electrode pads of a first wafer on which a readout integrated circuit (ROIC) circuit is formed;
   forming pad solders in the predetermined portion where the electrode pads are exposed and ring type joint solders along a surrounding of a MEMS sensor;
   forming a getter on the first wafer on which the pad solders and the joint solders are formed; and jointing a second wafer on which the MEMS sensor is formed on the first wafer on which the getter is formed.

2. The MEMS sensor packaging method of claim 1, wherein the joint solders and the pad solders are formed from a metal material.

3. The MEMS sensor packaging method of claim 2, wherein the joint solders and the pad solders are formed by using any one of a physical sputter, a thermal deposition process or a chemical plating process.

4. The MEMS sensor packaging method of claim 1, wherein the jointing is to joint the first and second wafers by using any one of thermo-compression (TC) bonding or eutectic bonding.

5. The MEMS sensor packaging method of claim 1, the getter is formed from a material comprising one or more selected from a group consisting of Ba, Ca, Mg, Ti, V, Zr, Nb, Mo, Ta, Th, and Ce, or one or more selected from a metal alloy group consisting of Ba—Al, Zr—Al, Ag—Ti, and Zr—Ni.

6. The MEMS sensor packaging method of claim 1, wherein the second wafer comprises, on the substrate, wetting layers in a pad type pattern, which are electrically connected to both side electrodes of the MEMS sensor, and wetting layers in a ring type pattern along the surrounding of the MEMS sensor, the joint solders are jointed correspondingly to the ring type pattern wetting layers and the pad solders are jointed correspondingly to the pad type pattern wetting layers.

7. The MEMS sensor packaging method of claim 1, wherein the MEMS sensor is electrically connected to the ROIC through the pad solders.

* * * * *